(12) United States Patent
Bhattacharya et al.

(10) Patent No.: US 11,579,994 B2
(45) Date of Patent: Feb. 14, 2023

(54) FAST AND SCALABLE METHODOLOGY FOR ANALOG DEFECT DETECTABILITY ANALYSIS

(71) Applicant: Synopsys, Inc., Mountain View, CA (US)

(72) Inventors: Mayukh Bhattacharya, Palo Alto, CA (US); Huiping Huang, San Jose, CA (US); Antony Fan, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/232,009

(22) Filed: Apr. 15, 2021

(65) Prior Publication Data

US 2021/0326227 A1 Oct. 21, 2021

Related U.S. Application Data

(60) Provisional application No. 63/011,101, filed on Apr. 16, 2020.

(51) Int. Cl.
*G06F 11/263* (2006.01)

(52) U.S. Cl.
CPC ................ *G06F 11/263* (2013.01)

(58) Field of Classification Search
CPC .......... G06F 11/263; G01R 31/318357; G01R 31/31835
See application file for complete search history.

(56) References Cited

U.S. PATENT DOCUMENTS

| 3,519,930 | A | * | 7/1970 | Bradley | G01R 1/28 323/354 |
| 3,619,804 | A | * | 11/1971 | Mears | G01S 11/10 331/8 |
| 5,640,328 | A | * | 6/1997 | Lam | G06F 30/33 716/113 |
| 6,202,183 | B1 | | 3/2001 | Ginetti et al. | |
| 6,526,546 | B1 | | 2/2003 | Rolland et al. | |

(Continued)

OTHER PUBLICATIONS

Williams, T. W. and Brown, N. C. (1981). "Defect Level as a Function of Fault Coverage". IEEE Transactions on Computers, C-30(12):987-988.

(Continued)

*Primary Examiner* — Matthew M Kim
*Assistant Examiner* — Matthew N Putaraksa
(74) *Attorney, Agent, or Firm* — Haynes Beffel & Wolfeld LLP; Andrew L. Dunlap

(57) ABSTRACT

A system and method of detecting defects in an analog circuit is provided. A method includes identifying a channel connected block (CCB) from a netlist, creating defect for the CCB to be injected during a simulation, obtaining a first measurement of an output node of the CCB by performing a first analog circuit simulation for the CCB based on providing excitations as inputs to the CCB and obtaining a second measurement of the output node of the CCB by performing a second analog circuit simulation for the CCB based on providing the excitations as the inputs to the CCB and injecting the defect. The method can further include determining a defect type based on the first measurement and the second measurement.

20 Claims, 9 Drawing Sheets
(3 of 9 Drawing Sheet(s) Filed in Color)

(56) References Cited

U.S. PATENT DOCUMENTS

| | | | | |
|---|---|---|---|---|
| 8,161,448 B1* | 4/2012 | Croix | .................... | G06F 30/367 |
| | | | | 716/136 |
| 8,195,439 B1* | 6/2012 | Hussain | ................ | G06F 30/367 |
| | | | | 703/14 |
| 10,128,740 B1* | 11/2018 | Xiong | ............... | H02M 3/33523 |
| 10,353,789 B1* | 7/2019 | Najibi | ................... | G06F 11/261 |
| 2002/0097068 A1* | 7/2002 | Morgan | ................ | H04L 25/242 |
| | | | | 326/86 |
| 2004/0207470 A1* | 10/2004 | Van Zanten | ........ | H03F 3/45645 |
| | | | | 330/258 |
| 2009/0030665 A1* | 1/2009 | Kerns | ................... | G06F 30/367 |
| | | | | 703/14 |
| 2009/0055780 A1* | 2/2009 | Acar | ................... | G06F 30/3312 |
| | | | | 716/132 |
| 2009/0164194 A1* | 6/2009 | Shrivastava | .......... | G06F 30/367 |
| | | | | 703/14 |
| 2010/0229061 A1 | 9/2010 | Hapke et al. | | |
| 2014/0059507 A1* | 2/2014 | Sunter | .................... | G06F 30/33 |
| | | | | 716/112 |
| 2018/0060472 A1* | 3/2018 | Chen | ................... | G01R 31/317 |
| 2018/0247968 A1* | 8/2018 | Na | ........................ | G01S 7/4914 |
| 2019/0034574 A1* | 1/2019 | Zhu | ....................... | G06F 30/392 |

OTHER PUBLICATIONS

Sunter, S. and Sarson, P. (2017). "A Publicly-Accessible Set of A/MS Benchmark Circuits". European Test Symposium, May 2017.

PCT/US2021/027559—International Search Report dated Jul. 26, 2021; 6 pages.

Brosa, A. M., et al., "On Maximizing the Coverage of Catastrophic and Parametric Faults," Proceedings of European Test Workshop 1999, ETWx99, EEE Computer Science, May 25-28, 1999, 123-128, 6 pages.

PCT/US2021/027559—Written Opinion dated Jul. 2021; 16 pages.

* cited by examiner

FAST AND SCALABLE METHODOLOGY FOR ANALOG DEFECT DETECTABILITY ANALYSIS

RELATED APPLICATION

This application claims priority to U.S. Provisional Application No. 63/011,101, filed on Apr. 16, 2020 and titled "FAST AND SCALABLE METHODOLOGY FOR ANALOG DEFECT DETECTABILITY ANALYSIS", the contents of which are incorporated by reference herein.

TECHNICAL FIELD

The present disclosure generally relates to analysis of analog circuitry. In particular, the present disclosure relates to performing defect detectability analysis for analog circuitry.

BACKGROUND

Digital fault simulation, testing, design-for-testability, etc., have matured to such a level that chances of failure in digital components are much lower than in analog components (e.g., analog circuitry) in modern-day mixed-signal integrated circuits (ICs). In a mixed signal application including both analog and digital components, it has been observed that as much as 80% of product returns due to defective chips are attributed to the analog portions of the circuits. The quality of manufacturing tests performed on an IC prior to release (i.e., test coverage) is directly related to the number of defective chips returned from customers. For example, the defect level (DL) of a component can be calculated as follows: $DL=1-Y^{(1-TC)}$, where Y=Yield and TC=Test Coverage.

SUMMARY

A method of detecting defects in an analog circuit or a portion thereof through analog circuit simulation is provided. The method can include identifying a channel connected block (CCB) within an analog circuit from a netlist, the CCB being a partition of the analog circuit determined based on impedances of nodes therein, creating a defect for the CCB to be injected during an analog circuit simulation, obtaining a first measurement of an output node of the CCB by performing a first analog circuit simulation for the CCB based on providing excitations as inputs to the CCB, obtaining a second measurement of the output node of the CCB by performing a second analog circuit simulation for the CCB based on providing the excitations as the inputs to the CCB and injecting the defect, and determining a defect type based on the first measurement and the second measurement.

In an implementation, the determining of the CCB from the netlist can include identifying a unique CCB by partitioning the analog circuit based on identifying power-nets in the analog circuit by analyzing a circuit graph obtained from the netlist, and disconnecting the circuit graph at the power-nets and high-impedance terminals, resulting in multiple partitions of the analog circuit, where one of the partitions is the unique CCB.

In another implementation, the two devices of the analog circuit can remain in the same partition when the two devices are connected to one another through low-impedance terminals, unless the low-impedance terminals touch a power-net.

In a further implementation, for a MOSFET device of the analog circuit, a gate terminal can be considered to be high-impedance and other terminals of the MOSFET are considered low-impedance.

In another implementation, the method can further include, for the CCB, preparing corresponding excitations as inputs and identifying corresponding types of measurements to capture as outputs, and performing the first and second analog circuit simulations using the prepared excitations and the identified types of measurements to capture.

In an implementation, wherein the creating of the defect for the CCB includes can include using a user-defined defect model to identify defects to be injected into the CCB, and creating a many-to-one mapping for the CCB, such that many defects are mapped to one or more devices of the CCB.

In another implementation, the method can further include considering the CCB to be two different unique CCBs instead of one, when the CCB has two different defect mappings.

In a further implementation, the method can further include identifying multiple unique CCBs from the netlist, and performing defect simulations on each unique CCB, such that each respective defect simulation performed on each unique CCB injects a different defect from a predefined list of defects.

In another implementation, the method can further include performing defect-free simulations on each unique CCB.

In an implementation, the method can further include analyzing measurements of the defect simulations and the defect-free simulations to identify, for each respective unique CCB, (i) an undetectable defect as an injected defect that results in a measurement that is the same as a measurement captured during the defect-free simulation and (ii) equivalent defects as injected defects that result in measurements that are equivalent to one another.

In a further implementation, the performing of the defect simulations, for each respective unique CCB, can include stimulating each respective CCB multiple times using corresponding excitations as the inputs while using a different defect injection for each of the multiple simulations, such that multiple sets of measurements are captured including at least one measurement for each individual defect having been injected.

In another implementation, the performing of the defect-free simulation and the performing of the defect simulations can be performed using at least one of an alternating current analysis sweep, a direct current analysis and a transient analysis.

In an implementation, the analyzing of the measurements can include comparing a measurement captured during the defect-free simulation as a result of one or more specific excitations to each measurement captured during the defect simulations using the one or more specific excitations, based on the comparing, identifying a measurement captured during the defect simulations that is the same as the measurement captured during the defect-free simulation, and identifying the defect that was injected that resulted in the measurement captured during the defect simulations being the same as the measurement captured during the defect-free simulation as an undetectable defect.

In a further implementation, a measurement captured during the defect simulations can be identified as being the same as the measurement captured during the defect-free simulation when they are within a predefined tolerance or threshold level of each other.

In another implementation, the analyzing of the measurements can include comparing each of the measurements captured during the defect simulations as a result of one or more specific excitations, identifying one or more measurements captured during the defect simulations as the result of the one or more specific excitations that are the same as one another, and identifying the defects that were injected that resulted in the one or more measurements that are the same as one another as equivalent defects.

In an implementation, the one or more measurements can be identified as being the same when they are within a predefined tolerance or threshold level of each other.

In a further implementation, a non-transitory computer-readable recording medium having instructions recorded thereon for detecting defects in an analog circuit can be provided. The instructions, when executed by a processor, can cause the processor to perform operations including identifying a channel connected block (CCB) within an analog circuit from a netlist, the CCB being a partition of the analog circuit determined based on impedances of nodes therein, creating a defect for the CCB to be injected during an analog circuit simulation, obtaining a first measurement of an output node of the CCB by performing a first analog circuit simulation for the CCB based on providing excitations as inputs to the CCB, obtaining a second measurement of the output node of the CCB by performing a second analog circuit simulation for the CCB based on providing the excitations as the inputs to the CCB and injecting the defect, and determining a defect type based on the first measurement and the second measurement.

In an implementation, a system including a memory storing instructions, and a processor, coupled with the memory and to execute the instructions is provided. The instructions when executed can cause the processor to identify a channel connected block (CCB) within an analog circuit from a netlist, the CCB being a partition of the analog circuit determined based on impedances of nodes therein, create a defect for the CCB to be injected during an analog circuit simulation, obtain a first measurement of an output node of the CCB by performing a first analog circuit simulation for the CCB based on providing excitations as inputs to the CCB, obtain a second measurement of the output node of the CCB by performing a second analog circuit simulation for the CCB based on providing the excitations as the inputs to the CCB and injecting the defect, and determine a defect type based on the first measurement and the second measurement.

In another implementation, a method can include generating a transistor-level netlist for each unique channel connected block (CCB) within the portion of the analog circuit to be subjected to the analog circuit simulation and for each respective unique CCB of the portion of the analog circuit, preparing corresponding excitations as inputs for the analog circuit simulation and identifying corresponding types of measurements to capture as outputs of the analog circuit simulation. Further, the method can include creating a list of defects for each unique CCB to be injected during the analog circuit simulation and performing the analog circuit simulation for each respective unique CCB by (i) performing a defect-free simulation using the corresponding excitations as the inputs and the corresponding types of measurements to capture as the outputs, without injecting any defects from the list of defects and (ii) performing defect simulations using the corresponding excitations as the inputs and the corresponding types of measurements to capture as the outputs, while injecting the defects from the list of defects, such that each respective defect simulation of the defect simulations performed on the respective unique CCB injects a different defect from the list of defects. Additionally, the method can include analyzing the measurements of each analog circuit simulation for each unique CCB to identify, for each respective CCB, (i) an undetectable defect as an injected defect that results in a measurement that is the same as a measurement captured during the defect-free simulation and (ii) equivalent defects as injected defects that result in measurements that are equivalent to one another.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The color drawing(s) also may be available in PAIR via the Supplemental Content tab.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
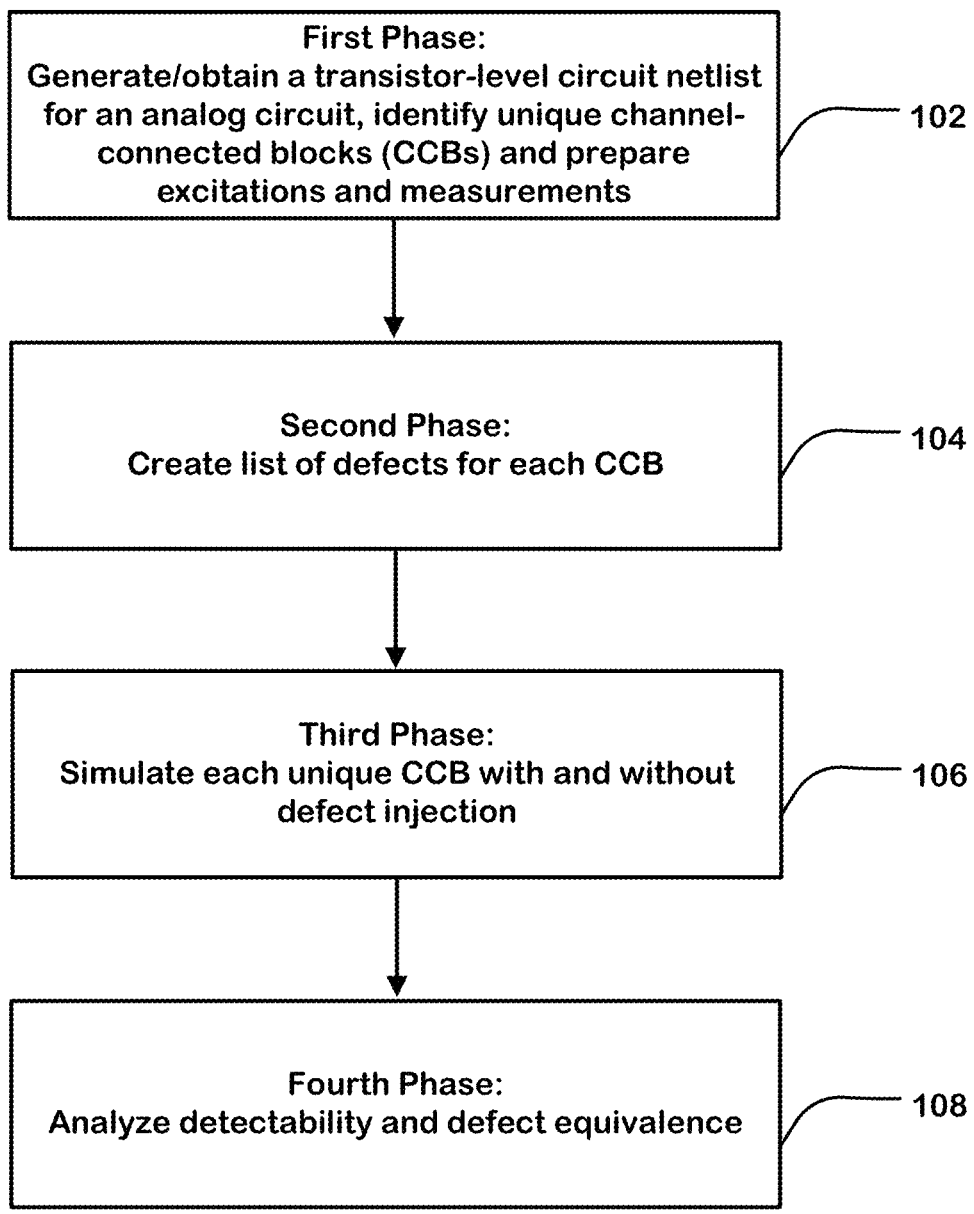
FIG. 1 illustrates various phases performed by the technology disclosed in order to accomplish analog defect detectability analysis.

Aspects of the present disclosure relate to fast and scalable methodology for analog defect detectability analysis.

Digital fault simulation, testing, design-for-testability, etc., have matured to such a level that chances of failure in digital components are much lower than in analog components in modern-day mixed-signal integrated circuits (ICs). In a mixed signal application including both analog and digital components, it has been observed that as much as 80% of product returns are attributed to the analog portions of the circuits. The quality of manufacturing test tests performed on an IC prior to release (i.e., test coverage) coverage is directly related to the number of defective chips returned from the field. The defect level (DL) of a product/component can be calculated as follows: $DL=1-Y^{(1-TC)}$, where Y=Yield and TC=Test Coverage. Therefore, a need arises to be able to better assess the coverage of analog circuit tests. In order to assess the coverage of the analog circuit tests, the technology disclosed provides an accurate and fast analog fault simulation.

For example, advanced driver-assist systems (ADAS) are becoming ubiquitous in modern cars and are projected to continue to grow as the automotive industry moves towards hands-off-eyes-off autonomous vehicles. Most of the integrated circuits at the heart of the ADAS technologies have a significant number of analog components. Fault simulation of mission-critical circuit components is often suggested as a methodology to compute quality metrics, such as a single point fault metric (SPFM), a latent fault metric (LFM) and a probabilistic metric for random hardware failures (PMHF), etc., as recommended by various functional safety standards (e.g., ISO 26262). Therefore, from manufacturing test coverage and from functional safety standpoints, there is a strong need to provide faster and more accurate analog defect simulation.

Despite the increasing importance of analog defect simulation, the adoption of analog defect simulators by analog designers has been slower than expected. One reason for this slow adoption of analog defect simulators is that often analog design has redundancy and feedback, making defects in many analog devices undetectable. For example, there are many analog devices in which, if there was a short between terminals or an open circuit at a terminal, it would be difficult, if not impossible to observe any behavior that is different from fault-free circuit behavior, unless one were to put controlling points (inputs) and observation points (outputs) very close to the device terminals. This holds true, no matter what input signals are used to excite the circuit and what external output ports are used to observe the effect of the excitation. Further, if an analog circuit designer, whose designed circuit has been working with very few defective field returns over decades, uses an analog defect simulator that cannot effectively calculate detectable defect coverage, the simulator would provide the user with defect coverage percentage that will be much less than the real defect coverage estimated by the circuit's past yield numbers.

Identifying these previously undetectable defects from the defect universe will lead to faster defect simulation times (as a simulator would need to simulate far fewer number of defects) and more accurate calculations of SPFM, LFM, PMHF, etc. based on defects that can cause circuits to behave dangerously. Without such defect detectability analysis capability, it is understandable that the circuit designer would be disinclined to use such a tool for a manufacturing test or for functional safety because of the unrealistic evaluation of defect coverage, test coverage, and diagnostic coverage numbers.

The technology disclosed addresses the problems described above and provides a practical and scalable solution for detecting defects in analog circuits. Specifically, the technology disclosed provides fast and scalable detectability analysis of analog defects in real industrial circuits.

FIG. 1 illustrates various phases performed by the technology disclosed in order to accomplish analog defect detectability analysis.

Specifically, as illustrated in FIG. 1, the technology disclosed has four phases 100. Each phase may include multiple operations. Described below are the different phases illustrated in FIG. 1 and the various operations performed in each phase.

Figure 2:
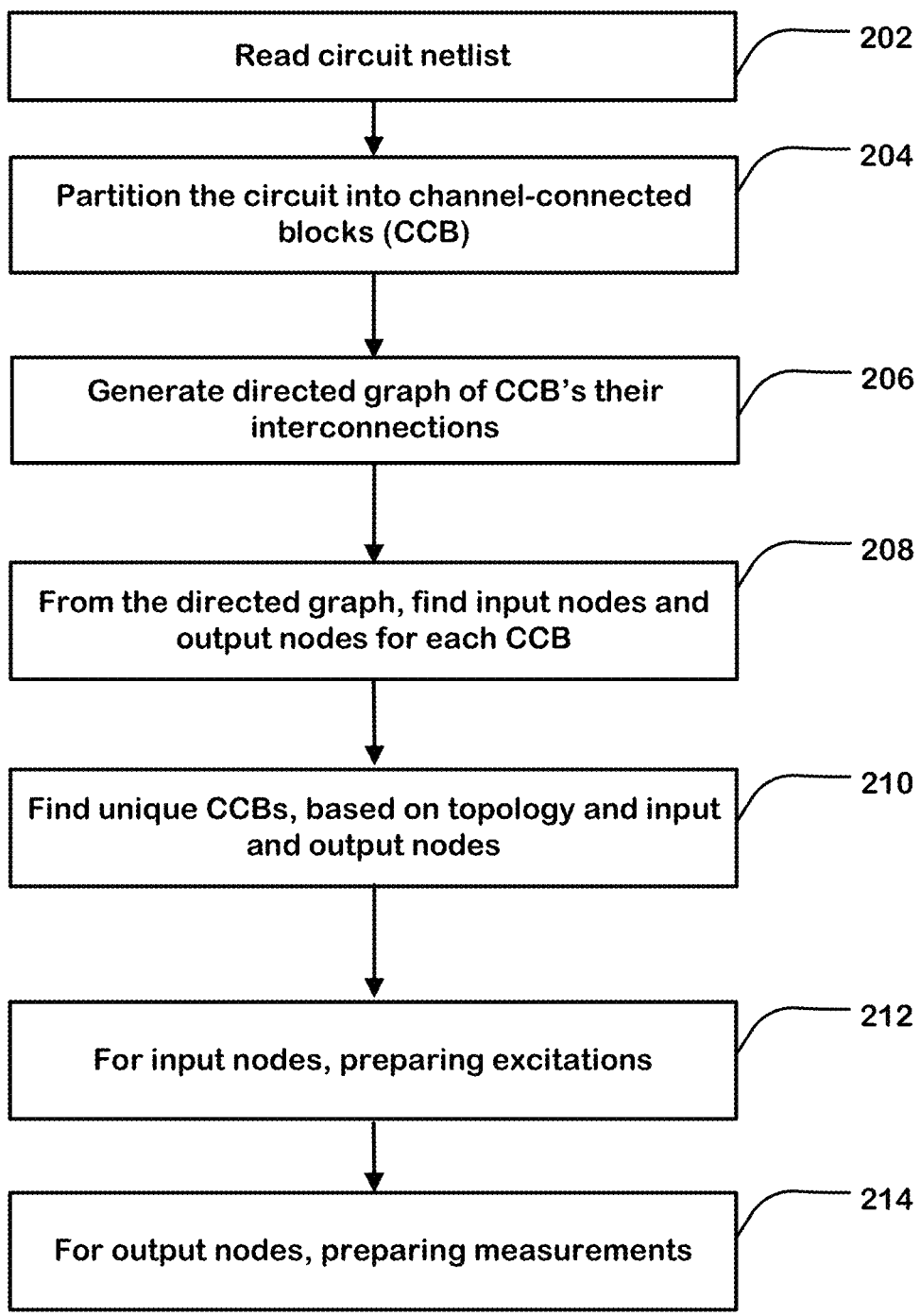
FIG. 2 illustrates the various operations involved in the first phase of FIG. 1.

A first phase 102 includes generating or obtaining a transistor-level netlist of the analog circuit or selected portions thereof and identifying unique channel connects blocks (CCBs) from the netlist. The first phase 102 also includes identifying, for each unique CCB, input nodes (e.g., excitation nodes) and output nodes (e.g., measurement nodes) as well as preparing excitations and measurements for simulations to be performed in a subsequent phase (e.g., a third phase 106). A netlist is a text-based representation of a circuit or of a subset of components of a circuit. Generally, a CCB is defined by partitioning a circuit, or a portion thereof, such that low-impedance branches (e.g., a source-drain of a MOSFET) are not separated into different partitions unless such a branch touches a power supply or other highly-connected nodes in the circuit, and such that the partitions are placed at high-impedance nodes of the circuit (e.g., the gate of a MOSFET). Defining CCBs are discussed in further detail below. Additionally, the description of FIG. 2 provided below describes additional operations performed in the first phase 102.

Figure 3:
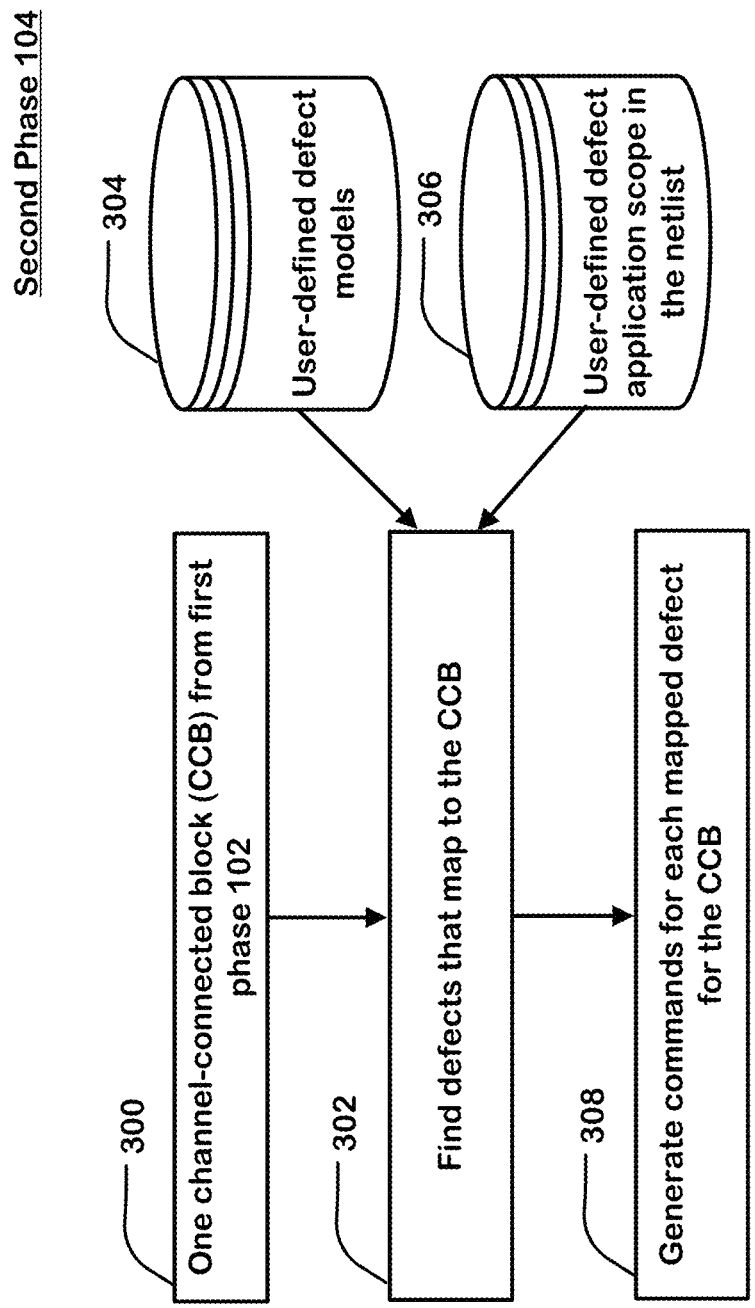
FIG. 3 illustrates mapping defects to channel connected blocks (CCBs), repeated for each unique CCB.

A second phase 104 includes creating (identifying) a list of defects for each CCB. The description of FIG. 3 provided below describes additional operations performed in the second phase 104.

A third phase 106 includes simulating each unique CCB with and without injecting defects and a fourth phase 108 includes analyzing detectability of defects and detectability of defect equivalence. This simulation can be performed using circuit simulation software such as PrimeSim XA® from Synopsys. The various operations of the third and fourth phases 106 and 108 are described in more detail below after the description of FIG. 3. The technology disclosed need not perform each operation and/or each phase in the order described herewith. Some operations can be performed in a different order and/or may not be performed at all.

As mentioned above, FIG. 2 illustrates the various operations involved in the first phase 102 of FIG. 1. Specifically, FIG. 2 illustrates seven example operations that can be included in the first phase 102 of FIG. 1.

Operation 202 includes loading a netlist of an analog circuit (or portion thereof) to be simulated into a database (e.g., a circuit database) or obtaining a database that includes the netlist. A netlist is a text-based representation of a circuit or of a subset of components of a circuit. Netlists can be in various formats. Some common formats include SPICE, SPECTRE and Eldo format.

Operation 204 includes using the netlist to partition the circuit into channel connected blocks (CCBs). The CCBs can be partitioned based on a method that identifies power-nets (power networks) in the analog circuit by analyzing a circuit graph obtained from the netlist. The circuit graph represents devices of the circuits and the connections between the devices, such that the circuit graph includes nodes representing the devices and edges that represent the connections between the nodes. Note that wire connections between elements of a circuit can be referred to as "nets." Wire connections between power (e.g., Vdd) or ground pads to other elements can be referred to as power-nets.

After the power-nets are identified, operation 204 performs sub-graph isomorphism on the circuit graph to identify arrays of repetitive structures, such as memory cells, etc. Regarding isomorphism, nets that touch high-impedance gate ports of a predefined and adjustable number of devices in the identified arrays are considered "word-lines," nets that were previously identified as power-nets, but only touch certain (e.g., some, but not all) metal oxide semiconductor field-effect transistor (MOSFET) channels of some of the cells, are considered to be "bit-lines" (i.e., these nets are no longer considered as power-nets).

After the repetitive structures are identified, operation 204 disconnects the circuit graph at the power-nets and bit lines (if any), as well as the high-impedance terminals (e.g., the gate terminal) of all MOSFETs.

This process described in operation 204 results in some of or all of the circuit netlist being partitioned into channel-connected device connections. Two devices can remain in the same partition if and only if they are connected through low-impedance terminals (e.g., in the case of MOSFETS, the gate terminal is considered high-impedance and the other terminals are considered low-impedance) unless the low-impedance terminals happen to touch a power-net or a bit-line. Each of the channel-connected device groups is called a channel connected block (CCB).

Operation 206 includes creating a directed graph. Specifically, operation 206 includes creating a directed graph (see FIG. 4 for an example directed graph) of the CCBs, such that each node of the graph is a CCB and such that there is an edge between any two nodes if there is a connection between two CCBs. An edge is directed from a low-impedance node in one CCB to a high-impedance node in the other CCB. For instance, consider two inverters (e.g., inverter A and inverter B) being identified as two CCBs. If inverter A drives inverter B, then the arrow between the two CCBs would be directed from inverter A towards inverter B. The direction of the arrow is related to a signal propagation path in the analog circuit.

Operation 208 includes input port identification (e.g., identification of excitation nodes), output port identification (e.g., identification of measurement nodes that are ports of a CCB that are input to other CCBs or that are ports that have been marked by a user as output nodes of a circuit) and power node identification (e.g., identification of Vdd and ground nodes) by finding nodes that are connected to many transistor channels and/or bulk terminals and then filtering the nodes that drive access transistors of memory cells, etc.). Specifically, according to operation 208, input ports and output ports are identified for each CCB, based on the connectivity of the CCB in the directed graph. For a CCB that may not be driving any other CCB(s), in case the CCB has one or more primary outputs of the circuit in it, such primary output nodes are the outputs of the CCB. The power nodes and bit-lines, as identified in operation 204, are marked or identified on the corresponding CCB terminals.

Operation 210 includes identifying topologically unique CCBs among the multiple partitions of the analog circuit. Note that the CCBs discovered in operation 204 are not all unique in structure and with respect to input and output ports. For example, two CCBs, even if they have the same channel connected structure, could be considered to be non-identical (unique) if different nodes in these CCBs are connected externally (as output ports) to other CCBs. In operation 210 simple graph-matching is performed to find unique CCBs with unique sets of input and output port nodes. The graph-matching may be implemented in many ways including the use of full-complexity graph isomorphism, the use of simple hashing of device and nodes followed by direct comparisons between graphs that share the same hash.

Operation 212 includes determining excitations for the input nodes, such that the determined excitations can be used during the simulation performed in the third phase 106. The excitations can be determined so that defect detectability can be determined for each CCB during the simulation. Defect detectability in each CCB can be studied using various methods (i.e., different types of excitations), some of which are discussed below.

For example, excitations can be determined so that alternating current (AC) simulation of the CCBs can be done at various frequencies. Different input ports can be assigned alternating current (AC) signals of various frequencies. The power inputs or bit-lines can be provided with low-frequency AC signals (low frequency because power-nets and bit-lines are heavily capacitively loaded making high-frequency activation unrealistic for such nets). If there is more than one input to a CCB and a designer is interested in three different frequencies (e.g., 0/DC, 100 Hz, and 1 MHz), then all possible frequency combinations are considered using various methods, such as multitone harmonic balance. This is usually not a problem as individual CCBs normally have very few inputs.

Further, excitations can be determined so that transient simulation (similar to AC simulation above) can be used, such that instead of using AC stimulus, sinusoidal time-domain signals can be used with the same frequencies as in AC simulation on the different input, power, and bit-line terminals. Combinations of frequencies can be considered as was done for AC analysis.

Alternately, excitations can be determined so that a transient simulation where each input terminal (non-power/non-bit-line) is provided with a pseudo-random piece-wise-linear (PR-PWL) waveform with an amplitude that is derived from the power-supply voltage of the circuit can be effective. The PR-PWL signals have many different frequency components and since they are not correlated, when applied to multiple input terminals, they can cover a wide variety of frequency combinations for the inputs in one transient simulation. The excitations can be determined so that the transient simulation can include the use of (i) pseudo-random piecewise constant waveforms (with random voltage values and periods), (ii) piecewise constant waveforms with power supply voltage values and various time periods, (iii) any combination of above-described wave forms and (iv) smart test pattern finding. Smart test pattern finding can include generating input patterns that maximize voltage between short nodes by graph algorithms and back propagation and can include other methods of analog test-pattern generation for circuits. More specifically, the smart test pattern finding can be based, for example, on heuristic search algorithms that vary the input signals to a CCB while trying to create conditions around a defect that would be as different as possible in the presence and absence of the defect. For instance, in the case of a short defect between two nodes, a smart test pattern finding algorithm can try to maximize the difference between the two nodes in a defect-free circuit. In the presence of a short defect, the two nodes would have the same potential, thus the defect would be activated by the input creating favorable conditions for the defect being detected at an output. Other machine-learning-based test-pattern generation can also be implemented by the technology disclosed herein.

As simulation time is concerned, AC analysis can be faster. However, PR-PWL transient simulation or sinusoidal-signal-based transient simulation are not significantly slower as the CCB circuits are usually small enough that the time difference is not very significant.

Operation 214 includes preparing measurements to obtain (capture) from the output nodes of the CCBs during simulation. Specifically, operation 214 includes, for each CCB, identifying and preparing specific types of measurements to obtain for each output node of each CCB during the simulation.

An example implementation of operation 214 can include using HSPICE .measurement statements that measure a waveform of a particular node, such as "Vout5." Specific example .measurement statements include (i) .measure tran m1 avg v(vout5) (which measures an average value for a specific transient time, where "m1" is the name of this measurement), (ii) .measure tran m2 rms v(vout5) (which measures the root mean square), (iii) .measure tran m3 max v(vout5) (which measures a maximum value), (iv) .measure tran m4 min v(vout5) (which measures a minimum value), (v) .measure tran m5 avg v(vout5) from=0.0 to=1e-7 (which measures an average value from time 0.0 to time 0.1 microsecond) and (vi) .measure tran m6 rms v(vout5) from=2e-6 to=3e-6 (which measures a root mean square from time 2 microsecond to 3 microsecond).

The output nodes are the observation ports. In order to judge if a defect may be detectable or not, the technology disclosed can automatically check if the effect of the defect is observable in at least one of the CCB's output nodes (i.e., is there an observable defect or is no defect observed when a defect is injected). For example, a short defect or an open defect can be deliberately injected at certain locations in a CCB. Specifically, the technology disclosed can inject a short defect (short circuit) between any two nodes/terminals of the CCB or it can inject an open defect (open circuit) at specific nodes/terminals of the CCB. These injected defects can model possible manufacturing defects, some of which may not be detectable in analog circuits. The technology disclosed is able to identify which types of defects would not be detectable if they were present in an analog circuit.

Operation 214 can configure the measurement the signals of the output nodes. In case of AC analysis, the frequency, phase, magnitude of the output nodes can be the measured quantities. In case of transient analysis, the time-domain signals at the output nodes could either be sampled periodically in time or using a windowed averaging technique, such as using a windowed root-mean-squared value can be used to measure output behavior. Note that in the fourth phase 108, the technology disclosed can compare the measured values for each defect simulation with the corresponding values for a fault-free simulation of the same CCB to measure detectability and defect equivalence.

FIG. 3 illustrates how defects are mapped onto each CCB in the second phase 104 illustrated in FIG. 1. Specifically, FIG. 3 illustrates mapping defects to channel connected blocks (CCBs), repeated for each unique CCB. The defects mapped to each unique CCB will be injected during the simulation of the analog circuit, as described below with reference to the third phase 106.

Operation 300 includes identifying each unique CCB identified in the first phase 102 and operation 302 includes finding defects that map to each unique CCB using user-defined defect models 304 and user-defined defect application scopes in the netlist 306. Specifically, the user-defined defect models 304 and the user-defined defect application scopes 306 are used to derive the defect universe (i.e., the defects to be injected) for the analog circuit (or portions thereof). The user-defined defect models 304 can include specific types of defects to inject (as short circuits, such as user-defined small impedances between notes or open circuits, such as user-defined large impedances at a device terminal) into the CCB during simulation and the user-defined defect application scopes 306 can identify specific scopes for applying defects. For example, each defect type may include one of a short circuit defect or an open circuit defect. The scope of the short circuit defect can include a device or sub-circuit model and two terminals of the device or sub-circuit, two nets in the circuit or two nodes in the circuit. The scope of the open circuit defect can include a device or sub-circuit model and one terminal of the device or sub-circuit, a net in the circuit or a node in the integrated circuit.

Operation 308 includes creating a many-to-one mapping between the device defects to be injected and the CCBs because each device can belong to one and only one CCB. For example, operation 308 can include creating a many-to-one mapping between the device defects to be injected and the CCBs because each device can belong to one and only one CCB. An open defect occurs where a terminal connection is disconnected from where it should be connected. For MOSFET, there can be 4 types of open defects including a drain open defect (also stuck-off), a gate open defect, a source open defect (also stuck-off) and a bulk open defect. A short defect occurs when an incorrect connection exists between two terminals. For MOSFET, there can be 6 types of short defects including a bulk-gate short defect (stuck-off), a bulk-drain short defect, a bulk-source short defect, a drain-gate short defect, a drain-source short defect (stuck-on) and a source-gate short defect.

If the same unique CCB has two different defect type mappings, then the technology disclosed considers the unique CCB to be two different CCBs instead of one. For example, for increased efficiency, when two CCBs are identical in every respect, then the technology disclosed can simulate only one CCB of the identical CCBs. However, when the defects being injected into the two CCBs are not identical, then the technology disclosed can simulate two different versions of the same CCB. Defects can be different in two otherwise identical CCBs because the defects injected are user-defined with user-defined application scope. This can vary from place to place within the same circuit.

The third phase 106 of FIG. 1 includes simulating each unique CCB with and without injecting defects. This third phase 106 includes using the excitations prepared in operation 212 and using the measurements prepared in operation 214. For example, for each set of input stimuli, each CCB needs to be simulated multiple times. One without any defect injection and once for each defect that is mapped to the CCB. There can be various ways to launch these simulations. For AC analysis, sweep feature could be used. For transient analysis, an ".ALTER" feature could be used— that is, for the same CCB netlist, the technology disclosed can sequentially run one simulation per mapped defect (i.e., the defects mapped in the second phase 104). Since the simulations are independent, they can all be run in parallel. From a detectability point of view, if a defect is deemed to be detectable based on one test, then further tests are not necessary. For example, in AC analysis, if a defect is detectable at using direct current (DC), then higher frequency simulations are not necessary. But, from defect collapsing point of view, this is not necessarily true. For finding equivalent defects, simulations at different frequencies should be performed.

The fourth phase 108 of FIG. 1 includes analyzing detectability of defects and of defect equivalence. Specifically, in the fourth phase 108, for each CCB, defects are evaluated for detectability and for equivalence.

For detectability, the output measurements for each defect simulation are compared against the fault-free measurements. If the result differences are less than some tolerance value (e.g., threshold, percentage, etc.) for each set of stimulus or frequency, then the defect is considered undetectable. Defects that are undetectable or that are hard to detect can be removed from the detectable defect universe or given a lower weight during calculation of defect coverage. This essentially means that even though a defect exists (or is simulated) the output of the CCB remains the same as the fault-free simulation. Therefore, the undetectable defect can be removed from analog circuit testing.

For equivalence, the technology disclosed considers the output measurement values of the detectable defects only. If two defects' output measurements under all stimuli and frequencies are identical or have negligible difference (with respect to some reasonable tolerance, threshold, percentage, etc.), then the two defects are electrically equivalent. Electrically equivalent defects (measurement) can be grouped together, as explained below in the "Example Results." For defects that are considered "equivalent," only one of them needs to be simulated for analog circuit testing. The simulation result for equivalent defects should be identical, hence, other defects the same equivalent group do not have to be simulated, as they can be assumed to have the same result as the one that was simulated. This speeds up analog defect simulation by reducing the number of simulations.

Example Results

To demonstrate how the technology disclosed works, an experiment was performed using an analog and mixed-signal (A/MS) benchmark phase lock loop (PLL) circuit from a suite presented in Sunter and Sarson, 2017 ("A Publicly-Accessible Set of A/MS Benchmark Circuits". European Test Symposium, May 2017.)

Figure 4:
FIG. 4 illustrates a CCB graph of a phase lock loop (PLL) circuit, where each node represents a CCB, green triangles represent inverters, purple triangles represent two-input NAND or NOR gates, red circles represent analog blocks and white circles represent blocks of unknown functionality.

FIG. 4 illustrates a CCB graph 400 of a phase lock loop (PLL) circuit, where each node represents a CCB, green triangles represent inverters, purple triangles represent two-input NAND or NOR gates, red circles represent analog blocks and white circles represent blocks of unknown functionality.

Figure 5:
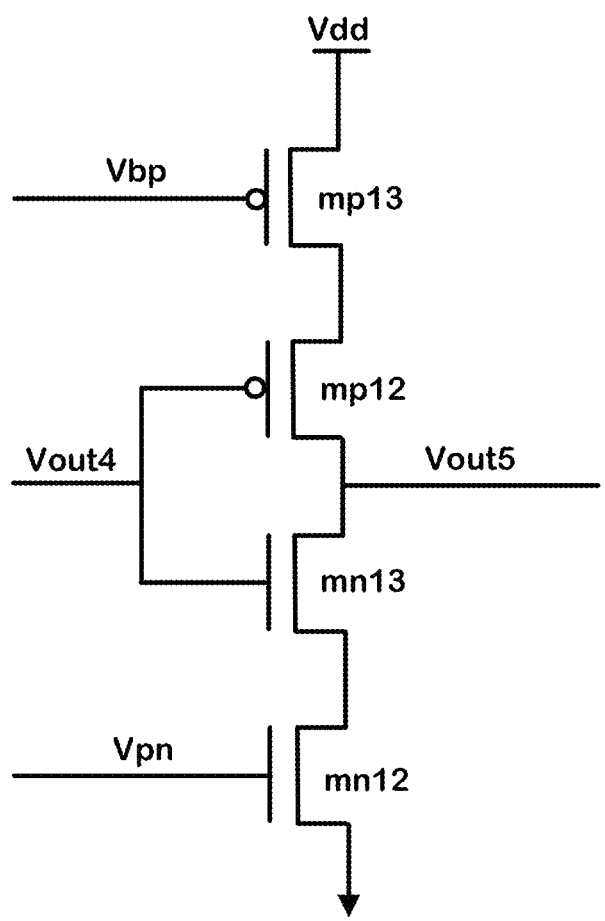
FIG. 5 illustrates a circuit of a particular CCB of FIG. 4, where "vbp," "vbn," and "vout4" are input nodes, "vout5" is an output node, "vdd" is a power node.

FIG. 5 illustrates a circuit 500 of the CCB graph 400 of FIG. 4.

Specifically, in FIG. 5, "mp13," "mp12," "mn13," and "mn12" represent n and p-type transistors, "Vbp," "Vbn," and "Vout4" are input nodes, "Vout5" is an output node, "Vdd" is a power node, which is held at 3.3V, and input stimuli are provided at the input nodes and the output is measured at the output node.

Figure 6:
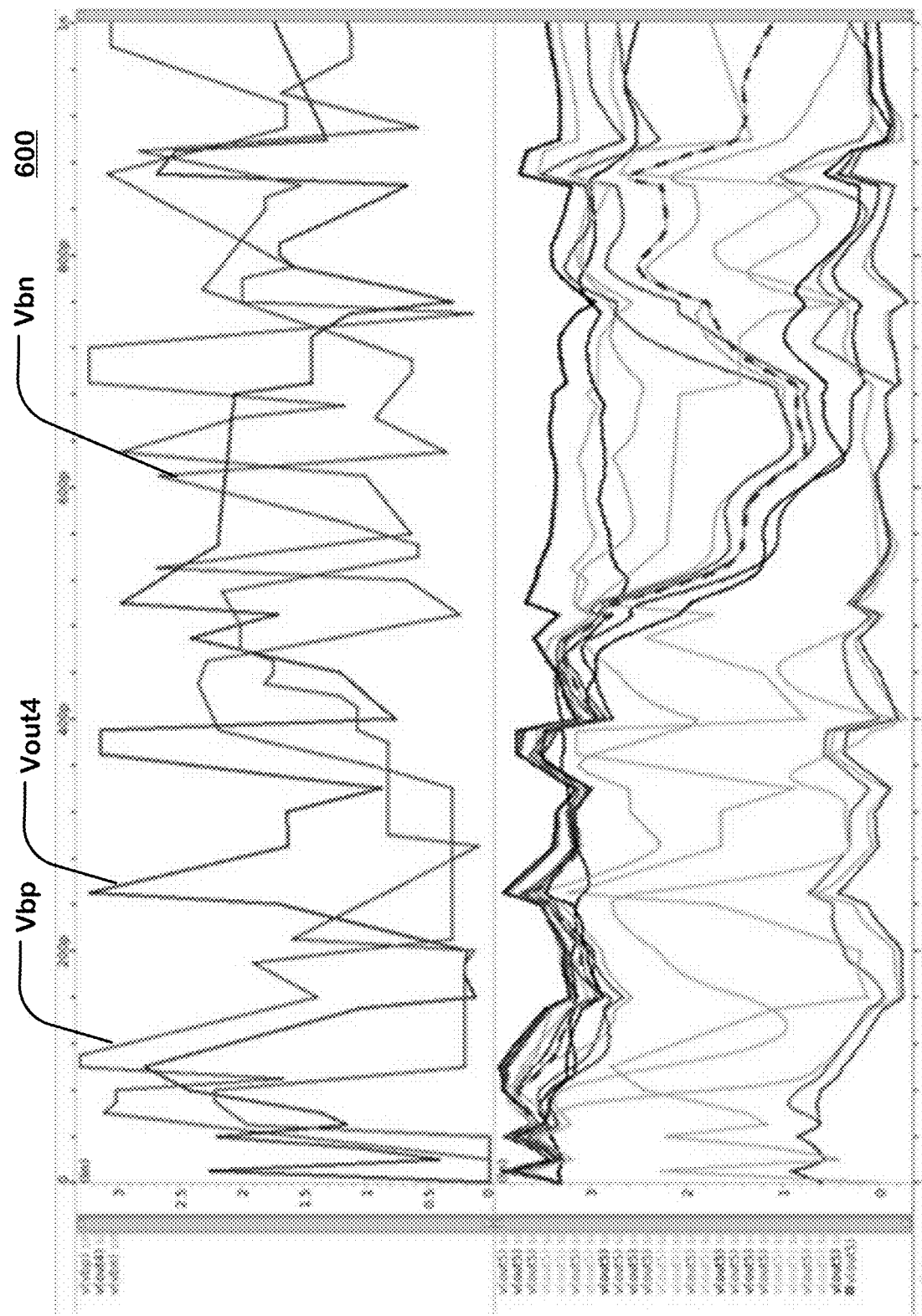
FIG. 6 illustrates three different short defects and three different open defects per transistor being injected and simulated.

FIG. 6 illustrates a chart 600 that includes the PR-PWL signals applied to the three inputs ("Vbp," "Vbn," and "Vout4") and the output signals (Vout5) from each of the twenty four defect simulations and the defect-free simulation. This chart 600 is an example of the inputs (excitations) and the outputs (measurements) of the simulation of the third phase 106.

Specifically, the three lines at the top of the chart 600 illustrated the three inputs. The dark blue line illustrates Vout4, the brown line represents Vbp and the red line represents Vbn. FIG. 6 illustrates three different short defects and three different open defects per transistor being injected and simulated. Since there are four transistors, twenty four defects were injected in all.

There are a total of twenty five lines on the bottom portion of the chart 600. A color index is at the left-hand side of the chart, such that the colors of the "v(out5)" label of the first twenty four items in the list that represent the defect simulations (i.e., the measurements obtained from the CCB as a result of injecting twenty four different types of defects during the simulation). The last "v(out5)" label of the list represents the defect-free simulation, which is the dashed line in the bottom portion of the chart 600.

Figure 7:
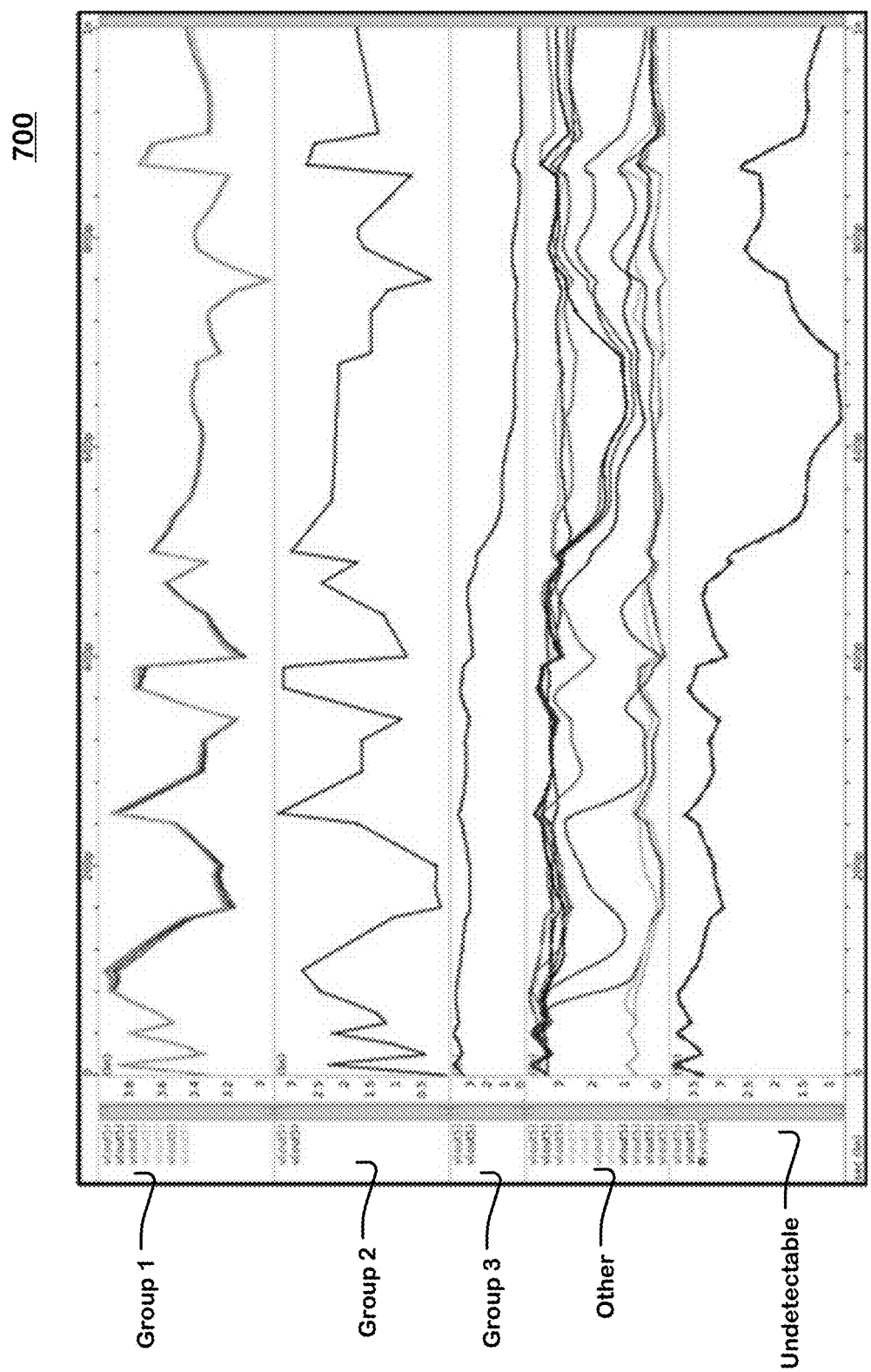
FIG. 7 illustrates splitting up lower-panel signals from FIG. 6 into different panels to show the undetectable defects (lowest panel) and different groups of equivalent defects of the top 3 panels.

FIG. 7 includes a chart 700 illustrating the result of grouping of the output signals. Specifically, FIG. 7 illustrates the lower-panel signals from FIG. 6 being split up into five different panels.

The lowest panel illustrates the undetectable defects, as discussed above with respect to the fourth phase 108 of FIG. 1. Further, the top three panel illustrate three different groups (i.e., Group 1, Group 2 and Group 3) of equivalent defects, as also discussed above with respect to the fourth phase 108 of FIG. 1. The fourth panel illustrates all the other defective simulation output signals which cannot be placed in any group of equivalent defects or undetectable defects. The undetectable defects are removed from "detectable defect universe" and can be removed from both numerator and denominator of any "detectable defect coverage" equation. (Weighted) Detectable defect coverage=(Sum of (Weights of) all detectable defects)/(Sum of (Weights of) all detectable defects). Equivalent defects are taken advantage of by simulating only one member of each equivalent defect set. Result of simulation of one member is shared with the rest. They are not removed from the universe just because they are equivalent. When a whole equivalent class of defects is considered undetectable, then all the defects in that class will be left out of the detectable defect universe. Conversely, when an equivalent defect group is considered detectable, then the entire group of defects is considered part of the detectable defect universe. Of course, by definition, an entire equivalent group should either be detectable or not detectable. It cannot be that part of an equivalent defect group is detectable and the other part is not detectable.

After detectability (i.e., identification of undetectable defects) and equivalence (i.e., identification of equivalent defects) are determined from the simulations using the CCBs, the technology disclosed can move to another phase. This other phase includes injecting faults into a full circuit (as opposed to simulations at a CCB level) and performing fault simulations using user-defined inputs and user-defined fault detection measurements, etc. on the full circuit. In this subsequent phase, the technology disclosed can take advantage of the determined "detectability" and "equivalence" findings from the CCB simulations. For example, the technology disclosed can leave out the undetectable defects (faults) from the fault universe when performing the fault simulation on the full circuit or the technology disclosed can assign a weight of 0 to the undetectable defects. Further, the technology disclosed can take advantage of the equivalent defects by reducing the number of fault simulations performed on the entire circuit. For example, if there are ten equivalent defects, the technology disclosed can pick just one of the equivalent defects and use the one equivalent defect for the fault simulation of the entire circuit. As a result, the fault simulation of the entire circuit will be much faster and efficient.

Table 1, provided below, shows the details of which defects are considered undetectable and which detectable defects are considered to be equivalent.

| DEFECT TYPE | INSTANCE NAME | PORTS | CLASSIFICATION |
|---|---|---|---|
| Short | Mn12 | S G | Undetected |
| Short | Mn12 | S D | Other |
| Short | Mn12 | G D | Other |
| Open | Mn12 | D | Group 1 (Equivalent) |

-continued

| DEFECT TYPE | INSTANCE NAME | PORTS | CLASSIFICATION |
|---|---|---|---|
| Open | Mn12 | G | Group 1 (Equivalent) |
| Open | Mn12 | S | Other |
| Short | Mn13 | G S | Other |
| Short | Mn13 | D G | Group 2 (Equivalent) |
| Short | Mn13 | D S | Other |
| Open | Mn13 | D | Group 1 (Equivalent) |
| Open | Mn13 | G | Group 1 (Equivalent) |
| Open | Mn13 | S | Group 1 (Equivalent) |
| Short | Mp12 | G S | Group 1 (Equivalent) |
| Short | Mp12 | D G | Group 2 (Equivalent) |
| Short | Mp12 | D S | Other |
| Open | Mp12 | D | Other |
| Open | Mp12 | G | Other |
| Open | Mp12 | S | Group 3 (Equivalent) |
| Short | Mp13 | S G | Undetected |
| Short | Mp13 | S D | Other |
| Short | Mp13 | G D | Other |
| Open | Mp13 | D | Group 3 (Equivalent) |
| Open | Mp13 | G | Other |
| Open | Mp13 | S | Other |

Figure 8:
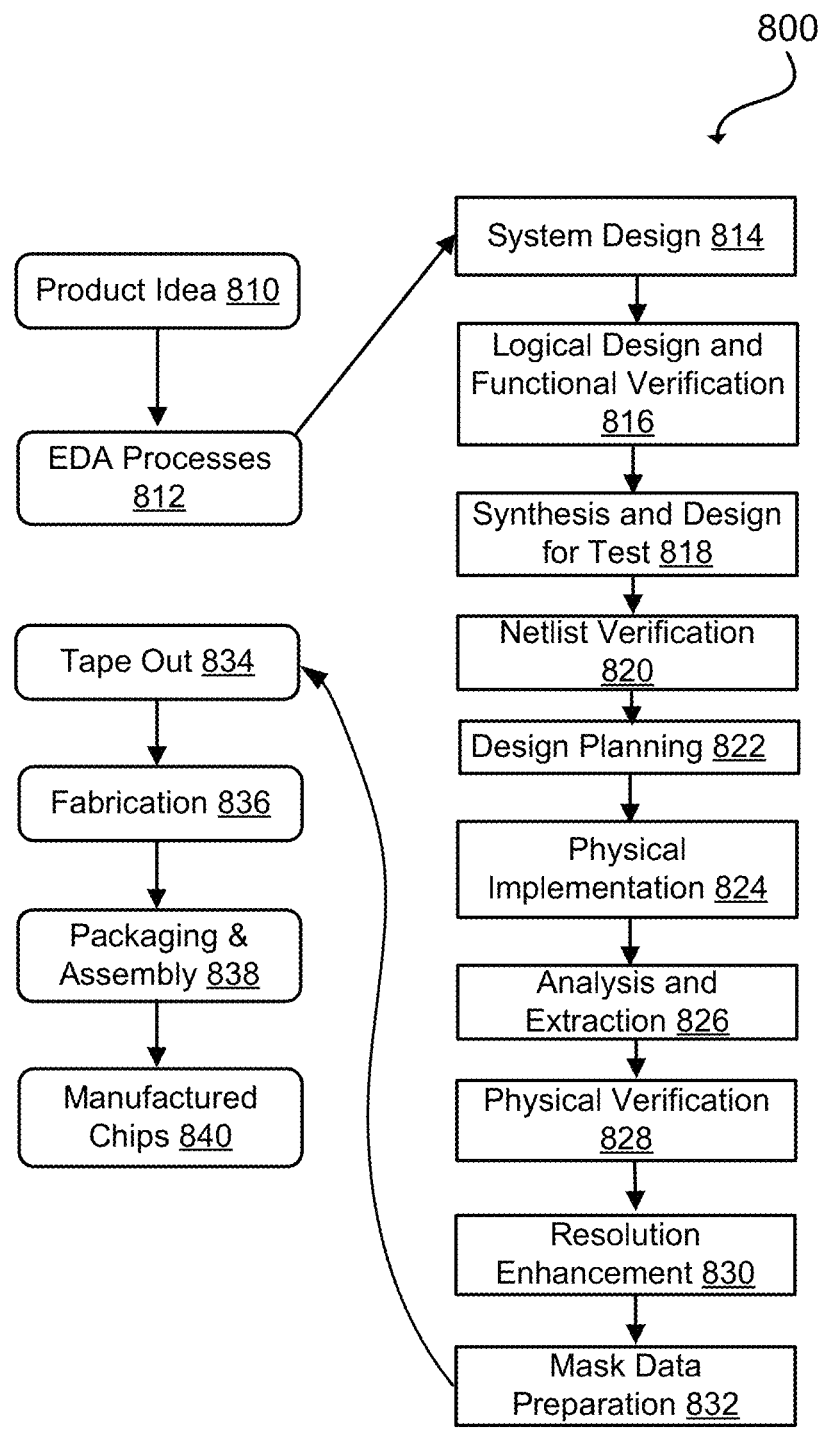
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 8. The processes described by be enabled by EDA products (or tools). The analog defect detectability analysis implemented by the technology disclosed can be implemented during the EDA process 812.

Specifically, the analog defect detectability analysis can be implemented along with the various stages of the EDA process 812 described below.

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
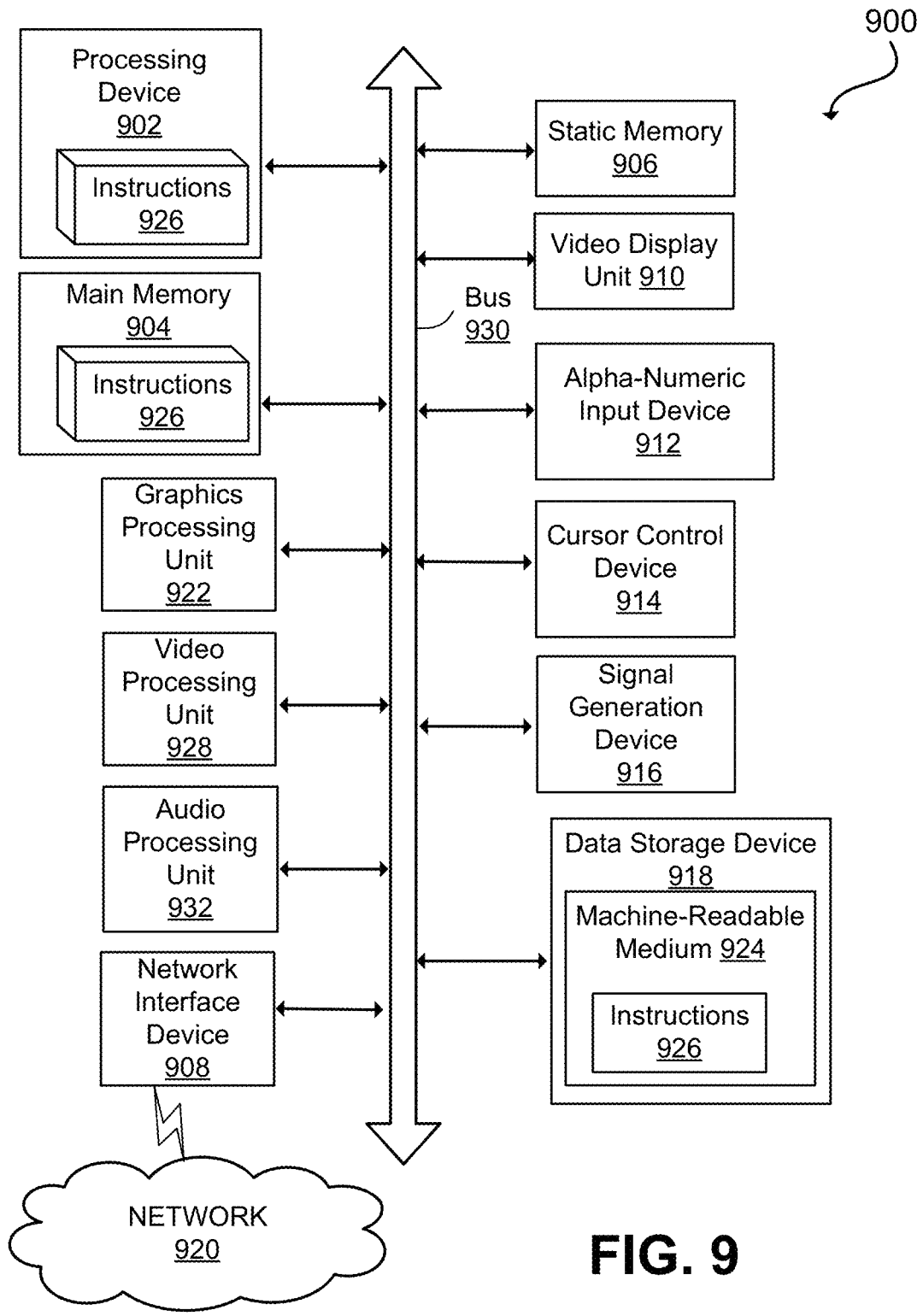
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and operations described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of detecting defects in an analog circuit, the method comprising:
    identifying a channel connected block (CCB) within an analog circuit from a netlist, the CCB being a partition that is defined based on high-impedance terminals of the analog circuit;
    creating a defect for the CCB to be injected during an analog circuit simulation;
    obtaining a first measurement of an output node of the CCB by performing a first analog circuit simulation for the CCB based on providing excitations as inputs to the CCB;
    obtaining a second measurement of the output node of the CCB by performing a second analog circuit simulation for the CCB based on providing the excitations as the inputs to the CCB and injecting the defect; and
    determining a defect type based on the first measurement and the second measurement.

2. The method of claim 1, wherein the determining of the CCB from the netlist includes identifying a unique CCB by partitioning the analog circuit based on:
    identifying power-nets in the analog circuit by analyzing a circuit graph obtained from the netlist; and
    disconnecting the circuit graph at the power-nets and the high-impedance terminals, resulting in multiple partitions of the analog circuit,
    wherein one of the partitions is the unique CCB.

3. The method of claim 2, wherein two devices of the analog circuit remain in a same partition when the two devices are connected to one another through low-impedance terminals, unless the low-impedance terminals touch a power-net.

4. The method of claim 2, wherein for a MOSFET device of the analog circuit, a gate terminal is considered to be high-impedance and other terminals of the MOSFET device are considered low-impedance.

5. The method of claim 1, further comprising:
    generating a directed graph including unique CCBs, such that each node of the directed graph is a unique CCB and such that there is an edge between any two nodes when there is a connection between two CCBs represented by the any two nodes; and
    for each respective unique CCB, identifying an input port, an output port and a power node,
    wherein the performing of the first or second analog circuit simulations includes, for each unique CCB, inputting corresponding excitations as the inputs on the identified input port and includes capturing measurements from the identified output port.

6. The method of claim 1, further comprising:
    for the CCB, preparing corresponding excitations as inputs and identifying corresponding types of measurements to capture as outputs; and
    performing the first and second analog circuit simulations using the prepared excitations and the identified types of measurements to capture.

7. The method of claim 1, wherein the creating of the defect for the CCB includes:
    using a user-defined defect model to identify defects to be injected into the CCB; and
    creating a many-to-one mapping for the CCB, such that many defects are mapped to one or more devices of the CCB.

8. The method of claim 7, further comprising considering the CCB to be two different unique CCBs instead of one, when the CCB has two different defect mappings.

9. The method of claim 1, further comprising:
    identifying multiple unique CCBs from the netlist; and
    performing defect simulations on each unique CCB, such that each respective defect simulation performed on each unique CCB injects a different defect from a predefined list of defects.

10. The method of claim 9, further comprising performing defect-free simulations on each unique CCB.

11. The method of claim 10, further comprising analyzing measurements of the defect simulations and the defect-free simulations to identify, for each respective unique CCB, (i) an undetectable defect as an injected defect that results in a measurement that is equal to a measurement captured during the defect-free simulation and (ii) equivalent defects as injected defects that result in measurements that are equivalent to one another.

12. The method of claim 11, wherein the performing of the defect simulations, for each respective unique CCB, includes:
    stimulating each respective CCB multiple times using corresponding excitations as the inputs while using a different defect injection for each of the defect simulations, such that multiple sets of measurements are captured including at least one measurement for each individual defect having been injected.

13. The method of claim 12, wherein the performing of the defect-free simulation and the performing of the defect simulations are performed using at least one of an alternating current analysis sweep, a direct current analysis and a transient analysis.

14. The method of claim 11, wherein the analyzing of the measurements includes:
    comparing a measurement captured during the defect-free simulation as a result of one or more specific excitations to each measurement captured during the defect simulations using the one or more specific excitations;

based on the comparing, identifying a measurement captured during the defect simulations that is equal to the measurement captured during the defect-free simulation; and identifying the defect that was injected that resulted in the measurement captured during the defect simulations being equal to the measurement captured during the defect-free simulation as an undetectable defect.

15. The method of claim 14, wherein a measurement captured during the defect simulations is identified as being equal to the measurement captured during the defect-free simulation when they are within a predefined tolerance or threshold level of each other.

16. The method of claim 11, wherein the analyzing of the measurements includes:

comparing each of the measurements captured during the defect simulations as a result of one or more specific excitations;

identifying one or more measurements, captured during the defect simulations as the result of the one or more specific excitations, that are equal to one another; and identifying the defects, that were injected that resulted in the one or more measurements being equal to one another, as equivalent defects.

17. The method of claim 16, wherein the one or more measurements are identified as being equal when they are within a predefined tolerance or threshold level of each other.

18. A non-transitory computer-readable recording medium having instructions recorded thereon for detecting defects in an analog circuit, the instructions, when executed by a processor, causing the processor to perform operations comprising:

identifying a channel connected block (CCB) within an analog circuit from a netlist, the CCB being a partition that is defined based on high-impedance terminals of the analog circuit;

creating a defect for the CCB to be injected during an analog circuit simulation;

obtaining a first measurement of an output node of the CCB by performing a first analog circuit simulation for the CCB based on providing excitations as inputs to the CCB;

obtaining a second measurement of the output node of the CCB by performing a second analog circuit simulation for the CCB based on providing the excitations as the inputs to the CCB and injecting the defect; and determining a defect type based on the first measurement and the second measurement.

19. The non-transitory computer-readable recording medium of claim 18, wherein the creating of the defect for the CCB includes:

using a user-defined defect model to identify defects to be injected into the CCB; and creating a many-to-one mapping for the CCB, such that many defects are mapped to one or more devices of the CCB.

20. A system comprising:

a memory storing instructions; and a processor, coupled with the memory and to execute the instructions, the instructions when executed causing the processor to:

identify a channel connected block (CCB) within an analog circuit from a netlist, the CCB being a partition that is defined based on high-impedance terminals of the analog circuit;

create a defect for the CCB to be injected during an analog circuit simulation;

obtain a first measurement of an output node of the CCB by performing a first analog circuit simulation for the CCB based on providing excitations as inputs to the CCB;

obtain a second measurement of the output node of the CCB by performing a second analog circuit simulation for the CCB based on providing the excitations as the inputs to the CCB and injecting the defect; and determine a defect type based on the first measurement and the second measurement.

\* \* \* \* \*